United States Patent
Vilangudipitchai et al.

(10) Patent No.: US 8,848,429 B2
(45) Date of Patent: Sep. 30, 2014

(54) LATCH-BASED ARRAY WITH ROBUST DESIGN-FOR-TEST (DFT) FEATURES

(71) Applicant: QUALCOMM Incorporated, San Diego, CA (US)

(72) Inventors: Ramaprasath Vilangudipitchai, San Diego, CA (US); Gaurav Bhargava, San Diego, CA (US); Ohsang Kwon, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 21 days.

(21) Appl. No.: 13/767,788

(22) Filed: Feb. 14, 2013

(65) Prior Publication Data
US 2014/0226395 A1    Aug. 14, 2014

(51) Int. Cl.
*G11C 11/00*    (2006.01)
*G11C 7/22*    (2006.01)

(52) U.S. Cl.
CPC ..................................... *G11C 7/222* (2013.01)
USPC ..................................... 365/154; 365/233.5

(58) Field of Classification Search
USPC .............................................. 365/154, 233.5
See application file for complete search history.

(56) References Cited

U.S. PATENT DOCUMENTS

| | | | |
|---|---|---|---|
| 5,659,690 A * | 8/1997 | Stuber et al. | 710/307 |
| 6,611,932 B2 | 8/2003 | How et al. | |
| 7,046,066 B2 | 5/2006 | Saado et al. | |
| 7,123,542 B2 | 10/2006 | Fekih-Romdhane et al. | |
| 7,134,058 B2 | 11/2006 | Lauga | |
| 7,313,739 B2 | 12/2007 | Menon et al. | |
| 7,487,417 B2 | 2/2009 | Branch et al. | |
| 7,676,709 B2 | 3/2010 | Chan | |
| 7,925,937 B2 | 4/2011 | Irby et al. | |
| 2005/0055592 A1 * | 3/2005 | Velasco et al. | 713/322 |
| 2008/0030245 A1 | 2/2008 | Elrod et al. | |
| 2008/0123452 A1 * | 5/2008 | Kim | 365/203 |

OTHER PUBLICATIONS

Intel, "Intel OpenSource HD Graphics Programmer's Reference Manual," Revision 1.0, http://intellinuxgraphics.org/documentation/IVB/IHD_OS_Vol1_Part6.pdf, May 31, 2012, Section 1.5.2, pp. 73.

* cited by examiner

*Primary Examiner* — Michael Tran
(74) *Attorney, Agent, or Firm* — Haynes and Boone, LLP

(57) ABSTRACT

A latch-based memory includes a plurality of slave latches arranged in rows and columns. Each column of slave latches receives a latched data signal from a corresponding master latch. Each row includes a clock gating circuit and a corresponding reset circuit. If a row is active for a write operation, the active row's clock gating circuit passes a write clock to the active row's slave latches. Conversely, the clock gating circuit for an inactive row gates the write clock to the inactive row's slave latches by passing a held version of the write clock in a first clock state to the inactive row's slave latches. While a reset signal is asserted, each reset circuit gates the write clock by passing the held version of the write clock in the first clock state to the slave latches in the reset circuit's row.

20 Claims, 5 Drawing Sheets

LATCH-BASED ARRAY WITH ROBUST DESIGN-FOR-TEST (DFT) FEATURES

TECHNICAL FIELD

This application relates to latch-based memory arrays, and more particularly to a master/slave latch-based memory array that enables the detection of reset faults for all rows despite the use of a partial scan chain.

BACKGROUND

Latch-based memory arrays such as master/slave latch-based arrays are a common ASIC element. These arrays may be two-dimensional such that the latches are arranged in rows and columns. The width of a row depends upon the array word size. For example, if the word size is 8 bits, a row would include eight slave latches. The depth of the array determines the column length: if the array stores 8 words, then each column would include eight slave latches. Each stored bit may correspond to an individual master/slave latch pair. But to save die space, it is known to use a single master latch for each column of slave latches. For example, FIG. 1 shows a column 101 in a latch-based memory 100 that includes a single master latch 105 that drives four slave latches 110. Each slave latch 110 in column 101 is in a corresponding row in the array, ranging from a row 0 to a row 3. If master latch 105 wasn't shared in this fashion, there would need to be three more master latches for column 101.

Each row of slave latches 110 is clocked by a corresponding row write clock 130 as produced by a row clock gating circuit (CGC) 120 for that row. Each row CGC 120 receives a write clock (WCLK) 125 that may be passed as the CGC's row write clock 130 if the row is active in a write operation. A row decoder or equivalent circuit (not illustrated) thus controls row clock gating circuits (CGCs) 120 depending upon whether a given row is active or inactive in a write operation. Should a row be inactive (no write operation for that row), the corresponding row CGC 120 gates its row write clock 130 by holding its row write clock 130 in a first clock state. Write clock 125 cycles between the first and second clock states to effect a write operation. For example, the first clock state may be ground (VSS) and the second clock state may be the power supply voltage VDD.

For illustration clarity, row CGCs 120 are shown receiving only the write clock (WCLK) 125 but in an actual implementation they would also receive the decoded word address from a word address decoder (or its equivalents). Analogous to the clocking for slave latches 110, each master latch 105 is clocked responsive to a master write clock 135 from a master clock gating circuit (master CGC) 150. But as known in the master/slave arts, master latches 105 are level sensitive to a first clock state for master write clocks 135 whereas slave latches 110 are level sensitive to a second clock state for their row write clocks 130. The gating action for row CGCs 120 is thus reversed as compared to the gating by master CGC 150. To gate its row write clock 130, a row CGC 120 holds its row write clock 130 in the first clock state since slave latches 110 will only latch for the second clock state. But master CGC 150 gates master write clock 135 by holding master write clock 135 in the second clock state since master latches 105 will only latch for the first clock state. Because memory 100 is written to a word at a time, master CGC 150 responds to the assertion of any word address in that all the master latches 105 are activated to latch their data input signal D during a write operation. Should a word address be asserted, master CGC 150 passes write clock 125 as master write clock 135 to the master latches 105. But if no word address is asserted (no active write operation for any of the rows) master CGC 150 gates write clock 125 by holding master write clock 135 in the second clock state.

To satisfy universal asynchronous reset (UAR) requirements, both master latch 105 and slave latches 110 in latch-based memory 100 are responsive to a reset signal (RST) 140. If reset signal 140 is asserted, the stored content for master latch 105 and slave latches 110 is reset accordingly. A scan path may be used to detect faults such as reset faults in latch-based memory 100. A test pattern can then be scanned in and scanned out of latch-based memory 100 as is known in the automatic test pattern generation (ATPG) arts. But note that there may be many instances of such two-dimensional latch-based memories in an integrated circuit. It would require a great deal of die area to set up a scan path that went through each and every row and column in all the latch-based arrays. Thus, it is conventional to implement a partial scan path through (for example) just the first row (denoted as row 0) and the last column in memory 100. Naturally, such a partial scan path can detect faults in the scanned row and column. But reset faults in un-scanned rows (e.g., rows 1, 2, and 3) are undetectable through a partial scan chain. For example, suppose there is a stuck-at-zero reset fault for a slave latch 110 in row 3. A partial scan chain that only passes through row 0 would be unable to detect such a fault.

The latched data outputs from the slave latches in column 101 are read though a read multiplexer 115. But faults in rows bypassed by a partial scan chain cannot be read through multiplexer 115 because the reset in a UAR system resets the address bits driving read multiplexer 115 to select for row 0. So the problem remains of numerous slave latches having untestable reset faults in partial scan chain systems. The partial chain scan cannot be lengthened to scan the un-scanned rows because of the excessive die demands.

Accordingly, there is a need in the art for master/slave latch-based memory arrays having improved design-for-test (DFT) features such that faults can be detected despite the use of a partial scan chain.

SUMMARY

A latch-based memory is disclosed that includes a plurality of slave latches arranged in rows and columns. Each column includes a corresponding master latch that drives a master-latched data signal to the slave latches in the column. Each row of slave latches is clocked by a row write clock driven through a corresponding row clock gating circuit and row reset circuit. Each row clock gating circuit receives a write clock. If a row is active for a write operation, the corresponding row clock gating circuit passes the write clock as its un-gated row write clock to the active row's slave latches. Conversely, the row clock gating circuits for the remaining inactive rows gate their row write clocks. Each row clock gating circuit for an inactive row gates its row write clock by holding its row write clock in a first clock state and passing the held row write clock to the inactive row's slave latches. To effect a write operation, the write clock cycles between the first clock state and a complementary second clock state such that the un-gated row write clock cycles accordingly. For example, the first clock state may be ground and the second clock state may be a power supply voltage VDD.

If a reset signal is asserted, each row reset circuit resets the corresponding row write clock by holding the corresponding row write clock in the second clock state and passing the held row write clock to the slave latches in its row. Conversely, each row reset circuit performs no resetting of the corresponding row write clock while the reset signal is de-asserted.

Each master latch has a reset input for receiving the reset signal. Thus, each master latch can be directly reset in response to the assertion of the reset signal. The master-latched data signals would be reset accordingly. Advantageously, the slave latches do not have a corresponding reset input. Instead, the slave latches are reset through their row write clocks being held in the second clock state by the reset circuits. Thus, the slave latches demand less die area as compared to conventional slave latches that required a direct reset ability to achieve Universal Asynchronous Reset (UAR) compliance. When the reset signal is asserted, the master-latched data signals from all the master latches are reset accordingly. At the same time, the slave latches are clocked by the held row write clock to latch the reset master-latched data signals from their respective master latches. In this fashion, all the slave latches may be reset despite having no direct reset capability.

The latch-based memory includes a partial scan chain that passes through a final column of flip-flops. The flip-flops correspond to the plurality of rows such that each flip-flop is clocked by the row write clock for its corresponding row. Thus, if one of the row write clocks for an un-scanned row has a stuck-at-zero fault, the corresponding flip-flop will not be clocked. The stuck-at-zero fault can thus be detected for any given row despite the use of a partial scan chain.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
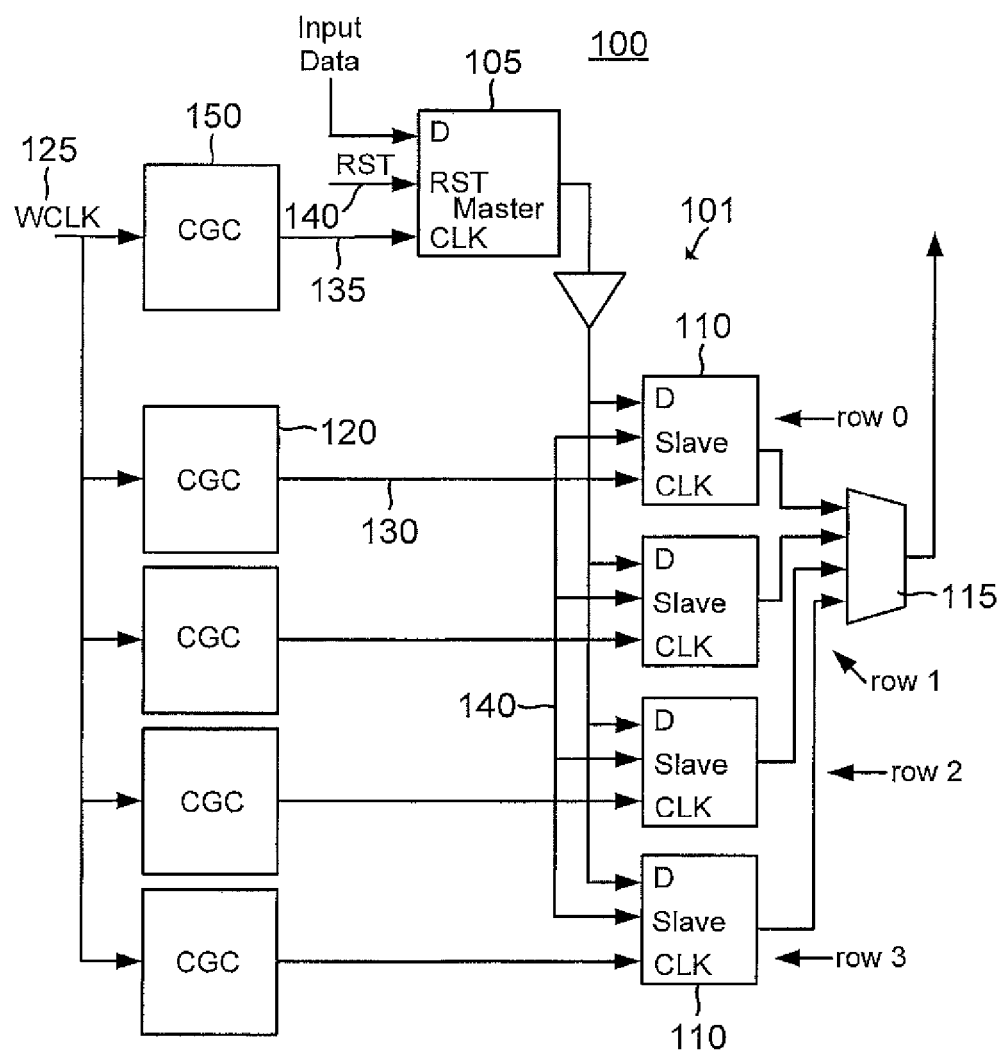
FIG. 1 is block diagram for a column of slave latches and their corresponding master latch for a conventional latch-based memory in which the slaves are directly resettable and in which stuck-at-zero faults for the reset signal cannot be detected for rows of slave latches that are not included in a partial scan chain.

A master/slave latch-based memory array is disclosed that provides robust design-for-test features despite the use of a partial scan chain. FIG. 2 shows an example latch-based memory 200. For illustration clarity, only a single column 201 of slave latches 210 is illustrated for latch-based memory 200. As discussed analogously with regard to FIG. 1, each column 201 includes a corresponding master latch 105 that provides a master-latched data signal 106 to the column's slave latches 210. Each slave latch 210 belongs to a corresponding row for latch-based memory 200. For illustration clarity, only four rows are shown for memory 200, from row 0 to row 3. Each column 201 of slave latches 210 corresponds to a bit position in the words stored in the rows. The actual number of rows depends upon the depth for memory 200. For example, if memory 200 can store eight words, then it would have eight rows such that each column 201 would include eight slave latches 210. Similarly, the length of each word determines the number of columns 201. For example, if the word length for memory 200 is eight bits, then it would have eight columns 201. However, a final column may comprise flip-flops as discussed further with regard to a partial scan chain 300 of FIG. 3.

Figure 2:
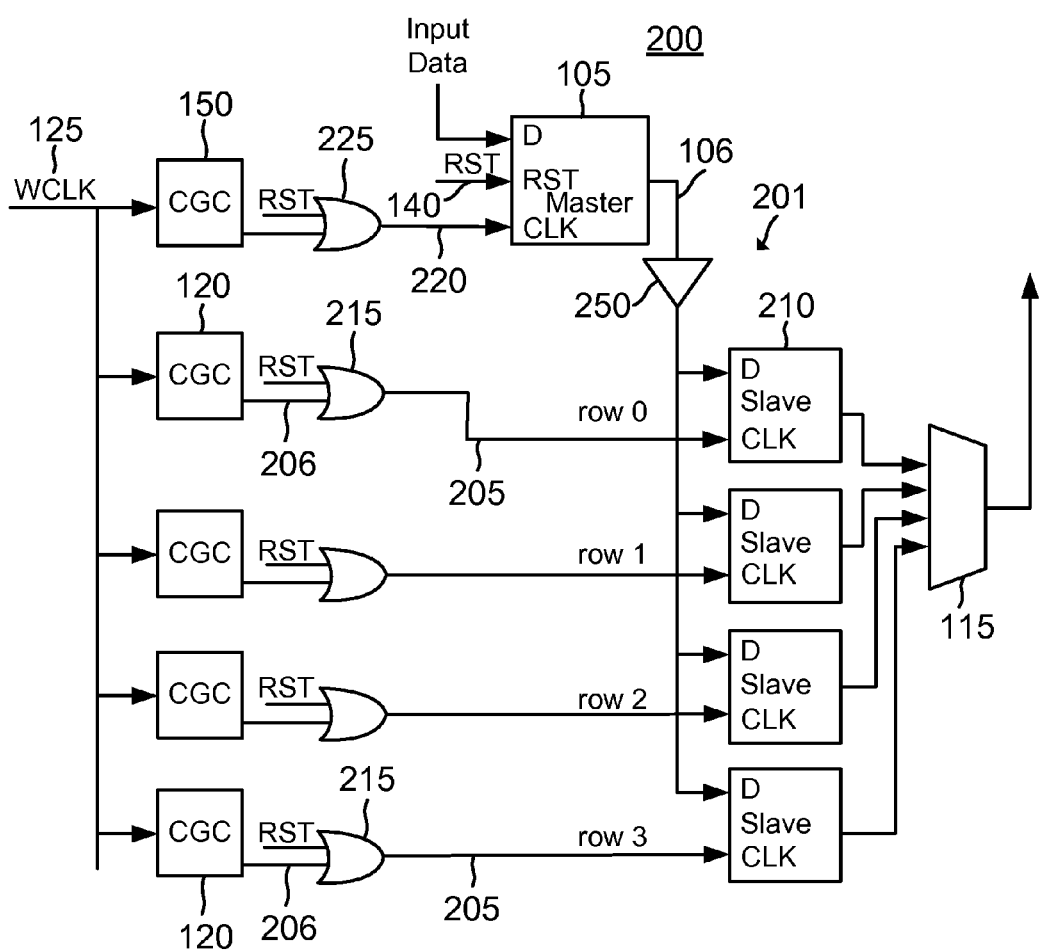
FIG. 2 is a block diagram for a column of slave latches and their corresponding master latch for a latch-based memory in which the slave latches do not have a reset signal input yet the latch-based memory is UAR compliant and in which stuck-at-zero faults for the row write clocking of slave latches in a row not included in the partial scan chain can still be detected through the partial scan chain.

As compared to slave latches 110 of FIG. 1, each slave latch 210 has no direct reset capability. Reset signal 140 thus cannot be received by slave latches 210. Such a simplification reduces die area demands for slave latches 210. Although slave latches 210 have no direct reset capability, memory 200 is still Universal Asynchronous Reset (UAR) compliant as discussed further herein. The slave latches 210 in each row are clocked by a corresponding row write clock 205. As discussed analogously with regard to memory 100, each row for memory 200 includes a row clock gating circuit (row CGC) 120 configured to receive write clock 125 and drive the corresponding row write clock 205 accordingly.

Should a row be active in a write operation, the corresponding row CGC 120 passes write clock 125 as corresponding row write clock 205 to the active row's slave latches 210 (assuming reset signal 140 is de-asserted). Write clock 125 cycles between a first clock state and a second clock state during a write operation. Thus, row write clock 205 for an active row cycles between the first and second clock states responsive to a corresponding cycle of write clock 125. The row CGCs 120 for inactive rows gate their row write clocks 205 analogously as discussed with regard to row write clocks 130 for memory 100. The row CGC 120 in an inactive row holds its row write clock 205 in the first clock state (e.g., VSS). Since slave latches 210 are level sensitive to the opposing second clock state (e.g., VDD), the slave latches 210 in the inactive rows are closed (no slave latching of master-latched data signal 106).

To enable a UAR capability, each row write clock 205 may be reset by a corresponding row reset circuit 215. Each row CGC 120 thus clocks the corresponding row's slave latches 120 by driving a clock output 206 through the corresponding row reset circuit 215 to form the corresponding row write clock 205. If reset signal 140 is de-asserted, each row reset circuit 215 is transparent to its row write clock 205. But if reset signal 140 is asserted, each row reset circuit 215 resets its row write clock 205 by holding its row write clock 205 in the second clock state. Slave latches 210 are level sensitive to the second clock state. The slave latches 210 for a given column 201 will thus latch master-latched data signal 106 from the corresponding master latch 105 while reset signal 140 is asserted. But each master latch 105 has a reset input and is thus directly resettable by reset signal 140 analogously as discussed with regard to memory 100. In this fashion, the master-latched data signal 106 from each master latch 105 is reset in response to reset signal 140 being asserted. But slave latches 210 will latch reset master-latched data signal 106 while reset signal 140 is asserted as discussed above. Thus, each slave latch 210 is reset in response to the assertion of reset signal 140 despite the lack of a direct reset capability. In other words, although each slave latch 210 lacks a reset input and thus advantageously saves die space, memory 200 is still UAR compliant.

Each row reset circuit 215 has no function unless reset signal 140 is asserted. In that regard, note that each row's slave latches 210 are clocked by the corresponding row write clock 205 for that row. In the default state (reset signal 140 being de-asserted), each row CGC 120 performs the gating of the corresponding row write clock 205 depending upon whether the row is inactive or active. But if reset signal 140 is asserted, each row reset circuit 215 resets its row write signal 205. It may thus be observed that clock output 206 from each row CGC 120 is the row write signal 205 in the default state. In contrast, clock outputs 206 are blocked from driving corresponding row write clocks 205 while reset signal 140 is asserted.

In one embodiment, each row reset circuit 215 may comprise an OR gate (also indicated as element 215 for memory 200). Each row's OR gate 215 performs a logical OR on the row's clock output 206 with reset signal 140 to determine whether it resets its row write clock 205. The reset function for each OR gate 215 may be performed by other types of logic gates in alternative embodiments.

A master write clock 220 clocks the master latch 105 in each column. During default operation (while reset signal 140 is de-asserted and no write operation is active), master clock gating circuit (master CGC) 150 gates write clock 125 by holding master write clock 220 in the second clock state as discussed analogously with regard to mater write clock 135 for memory 100. In that regard, each master latch 105 is level sensitive to the first clock state whereas slave latches 210 are level sensitive to the second clock state. The following discussion will assume without loss of generality that the first clock state is low (ground or VSS) whereas the second clock state is high (VDD). Master CGC 150 thus gates write clock 125 by holding master write clock 220 high. Should a write operation be active (one of the row addresses being asserted), master CGC 150 passes write clock 125 as master write clock 220. In contrast, row CGCs 120 gate write clock 125 by holding their row write clocks 205 low. A master reset circuit 225 functions analogously as discussed with regard to row reset circuits 215 to reset master write clock 220 by holding master write clock high 220. It will be appreciated that memory 200 may be readily converted into a bit-access with respect to write operations (as opposed to writing a word at a time) by dedicating a CGC to each master latch 105.

Because each column's master latch 105 must drive master-latched data signal 106 to all the slave latches 210 in the column, each master-latched signal 106 may be boosted by one or more buffers 250. As discussed with regard to memory 100, the latched contents for slave latches 210 are read through a read multiplexer 115.

Figure 3:
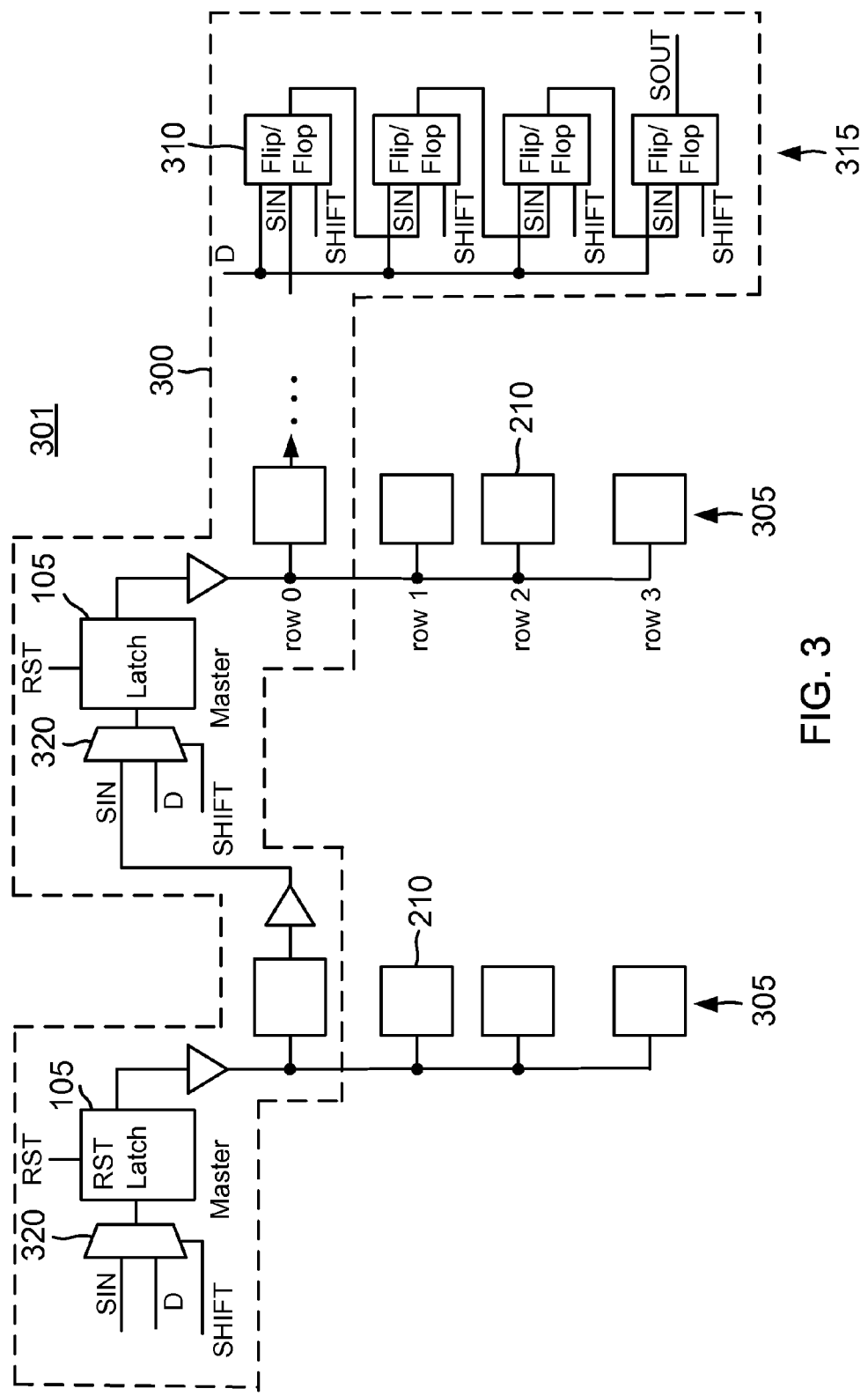
FIG. 3 illustrates the partial scan chain for the latch-based memory of FIG. 2.

A partial scan chain 300 for a latch-based memory 301 is shown in FIG. 3. Latch-based memory 301 includes a plurality of master/slave columns 305 analogous to column 201 of latch-based memory 200. For illustration clarity, only two master/slave columns 305 are shown in FIG. 3. A final column 315 comprises flip-flops 310 instead of a master latch and corresponding slave latches. For additional illustration clarity, only four rows are shown in FIG. 3, ranging from a row 0 to a row 3. There are thus four slave latches 210 in each master/slave column 305 and four flip-flops 310 in final column 315. A data input for each column's master latch 105 is driven by a corresponding scan chain multiplexer 320 that can select between a data input signal D and a scan-in signal (SIN). Similarly, each flip-flop 310 can register either a data input signal D or a scan-in-signal (SIN). Partial scan chain 300 extends through each master latch 105 and the slave latches 210 in row 0. In addition, partial scan chain 300 extends from a slave latch of row 0 in a next-to-last column (not illustrated) through flip-flops 315. Each consecutive storage element in partial scan chain 300—whether it a master latch 105, a slave latch 210, or a flip-flop 310—receives as its scan-in signal (SIN) a scan-out signal (SOUT) from a preceding storage element in partial scan chain 300. A shift signal (SHIFT) controls each scan multiplexer 320 to select for its scan-in signal (SIN) when partial scan chain 300 is active. Similarly, the shift signal (SHIFT) controls whether each flip-flop 310 registers its scan-in signal (SIN).

During normal operation (no scanning), master latches 105 and slave latches 210 latch data input signal D responsive to the corresponding master write clock (not illustrated) and respective row write clocks (not illustrated). Similarly, each flip-flop 310 registers its data input signal D responsive to clock edges in the row write clock for the flip-flop's row. Thus, suppose a stuck-at-zero fault exists in the row write clock for row 3. Partial scan chain 300 does not extend through the slave latches 210 for this row. But the row write clock for row 3 clocks the flip-flop for row 3. Thus, if this row write clock is faulty, the expected data will not be latched in the flip-flop for row 3. Such a fault can then be detected by shifting out the contents of the flip-flop for row 3 using partial scan chain 300. Thus, the latch-based memories disclosed herein such as latch-based memories 200 and 301 enable the detection of stuck-at-zero faults for all the row write clocks despite having only a partial scan chain 300.

Figure 4:
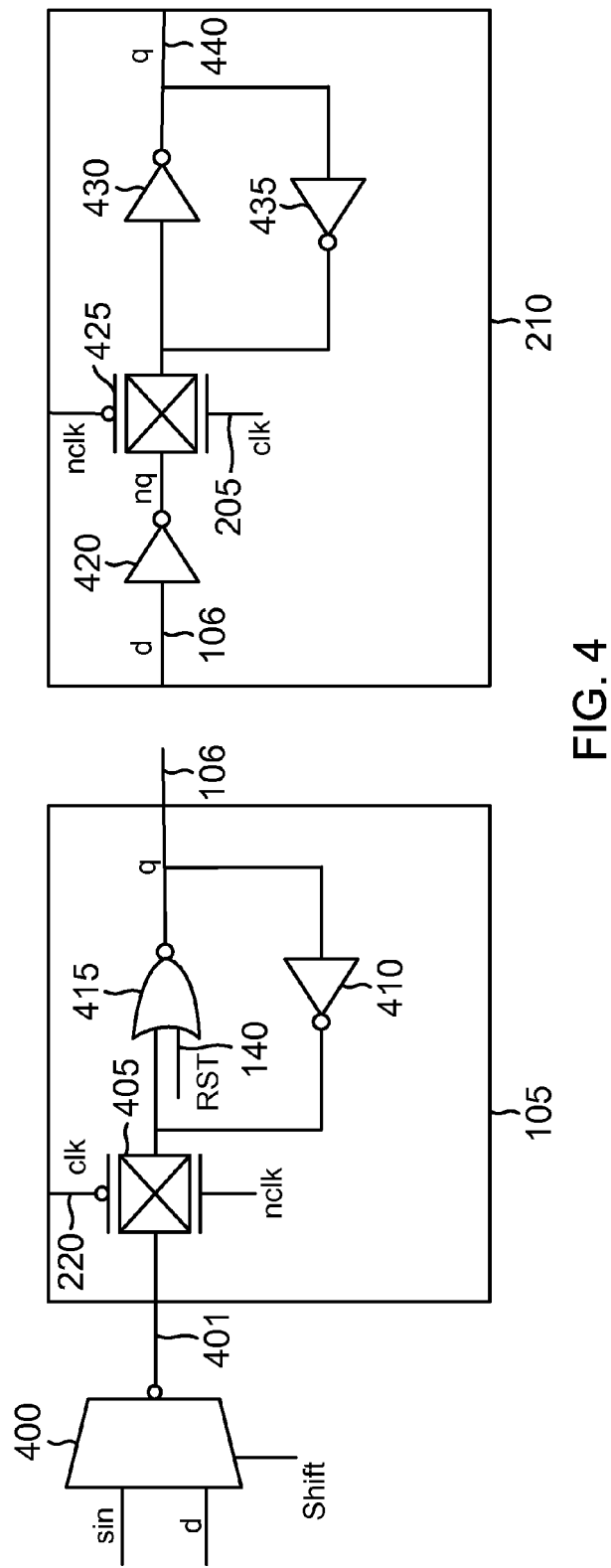
FIG. 4 is a schematic diagram for an example master latch and slave latch for the latch-based memory of FIG. 2.

FIG. 4 is a schematic diagram for a master latch 105 and one of its slave latches 210. An inverting scan chain multiplexer 400 is configured to select between a scan-in signal (sin) or an input data signal d responsive to a shift signal to provide an input signal 401 to master latch 105. Master latch 105 includes a transmission gate 405 configured to turn on in response to master write clock 220 being in the first clock state (VSS) to pass input signal 401 into master latch 105. A cross-coupled inverter 410 and a NOR gate 415 latch input signal 401 when it is passed through transmission gate 405. Input signal 401 and an output signal from cross-coupled inverter 410 both drive one input for NOR gate 415. In addition, NOR gate 415 receives reset signal 140 as a second input. If reset signal 140 is de-asserted, NOR gate 415 thus acts as a cross-coupled inverter to cross-coupled inverter 410 with regard to latching input signal 401 when master write clock 220 is brought low. The input data signal d may thus be latched in an inverted form as master-latched data signal 106 (q).

Slave latch 210 receives master-latched data signal 106 through an inverter 420 to produce an inverted signal nq. Signal nq is received by a transmission gate 425 that is configured to be conductive while row write clock 205 is asserted high. A pair of cross-coupled inverters 430 and 435 are configured to latch signal nq after it passes through transmission gate 425 to provide a slave-latched output signal 440. Since slave-latched output signal 440 will have the same logical state as master-latched data signal 106, it may also be denoted by the letter q.

If the master latch 105 is reset, NOR gate 415 drives master-latched data signal 106 low. As discussed with regard to memory 200, the assertion of reset signal 140 resets row write clock 205 high. Thus, transmission gate 425 in the slave will be open while reset signal 140 is asserted such that cross-coupled inverters 430 and 435 latch the low value for master-latched data signal 106. In this fashion, slave latch 210 can be reset (latch a low signal) through the reset of its master latch 105 and its row write clock 205. This is quite advantageous in that slave latch 210 demands less die space than a resettable latch such as master latch 105. In addition, stuck-at-zero faults for the row write clocks 205 may be detected as discussed with regard to FIG. 3.

Figure 5:
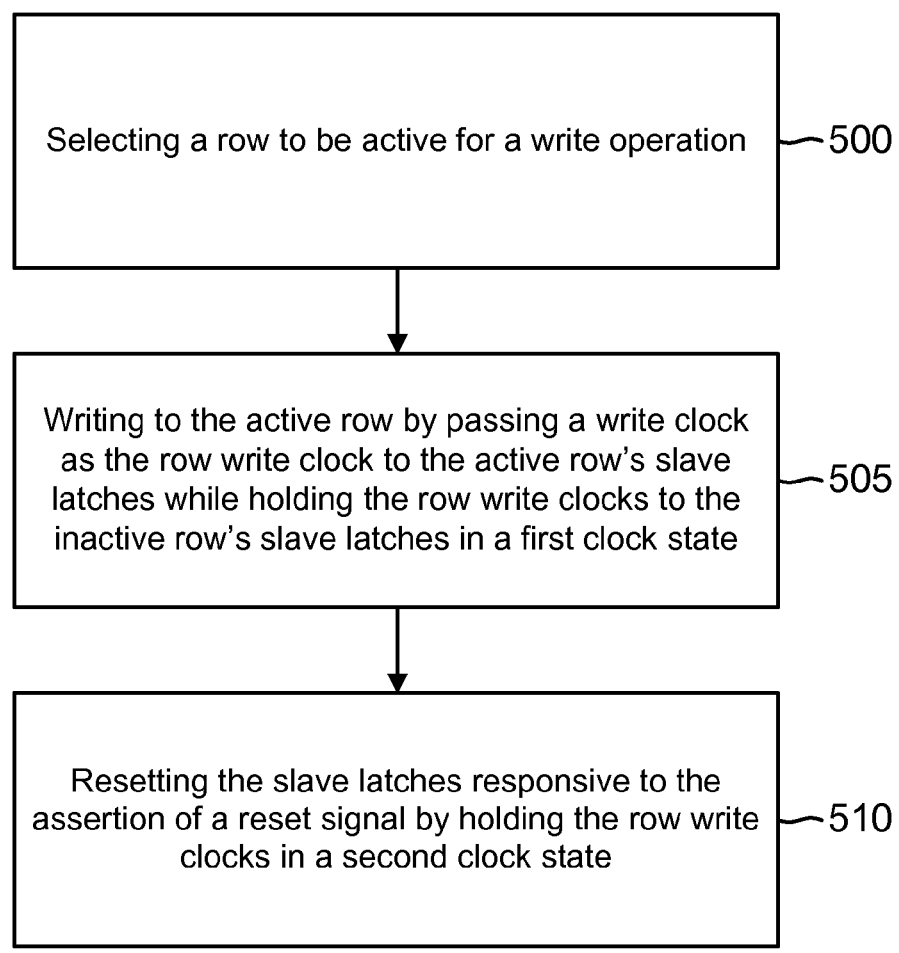
FIG. 5 is a flowchart for a method of resetting the slaves in a latch-based memory wherein the slaves do not have a reset signal input yet the latch-based memory is UAR compliant.

A method of resetting slave latches will now be discussed with regard to the flowchart of FIG. 5. The method begins with the selection of a row for a write operation in a step 500. The selected row is thus the active row while all the remaining rows in the latch-based memory are inactive. The slave latches in each row are clocked responsive to a corresponding row write clock. In a step 505, the active row is written to responsive to passing a write clock as the row write clock to the active row's slave latches while the row write clocks for the inactive rows are gated by being held in a first clock state. The write clock cycles between the first clock state and a second clock state. Thus, the row write clock for the active row cycles as does the write clock during the write operation. In a step 510, all the slave latches are reset responsive to an assertion of a reset signal by holding the row write clocks in the second clock state.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A latch-based memory, comprising:
   a plurality of slave latches arranged into a plurality of rows, each row being configured to be clocked by a corresponding row write clock;
   a plurality of row clock gating circuits corresponding to the plurality of rows, each row clock gating circuit (row CGC) being configured to gate the corresponding row write clock for its row responsive to its row being inactive for a write operation by holding the corresponding row write clock in a first clock state; and
   a plurality of row reset circuits corresponding to the plurality of rows, each row reset circuit configured to reset the corresponding row write clock for its row responsive to an assertion of a reset signal by holding the corresponding row write clock in a second clock state.

2. The latch-based memory of claim 1, wherein the row CGC and row reset circuit for each row are configured to pass a write clock as the corresponding row write clock for the row responsive to the row being active for the write operation.

3. The latch-based memory of claim 2, wherein each row reset circuit comprises a logic gate configured to process an output clock signal from the corresponding row CGC and the reset signal to reset the corresponding row write signal.

4. The latch-based memory of claim 3, wherein each row reset circuit comprises an OR gate.

5. The latch-based memory of claim 1, wherein the plurality of slave latches are further arranged into a plurality of columns, the latch-based memory further comprising a plurality of master latches corresponding to the plurality of columns, each master latch configured to provide a master-latched data signal to the slave latches in the corresponding column, each master latch configured to reset its master-latched data signal responsive to an assertion of the reset signal.

6. The latch-based memory of claim 5, wherein each master latch is configured to be clocked by a master write clock, the latch-based memory further comprising:

a master clock gating circuit (master CGC) configured to gate the master write clock by holding the master write clock in the second clock state; and
a master reset circuit configured to reset the master write clock responsive to the assertion of the reset signal by holding the master write clock in the second clock state.

7. The latch-based memory of claim 6, wherein the master reset circuit comprises a logic gate configured to process a clock output from the master CGC and the reset signal to reset the master write clock.

8. The latch-based memory of claim 7, wherein the master reset circuit comprises an OR gate.

9. The latch-based memory of claim 6, wherein each master latch is configured to latch an input data signal as its master-latched data signal responsive to receiving the master write clock in the first clock state.

10. The latch-based memory of claim 5, wherein each slave latch is configured to latch the master-latched data signal from the master latch in the corresponding column responsive to the slave latch receiving the corresponding row write clock in the second clock state.

11. The latch-based memory of claim 6, further comprising:
    a final column of flip-flops corresponding to the plurality of rows; and
    a partial scan chain configured to pass through the master latches, a first row of the slave latches, and the final column of flip-flops, and wherein each flip-flop is configured to be clocked by the row write clock for the corresponding row such that reset faults in a given row are detectable through the partial scan chain.

12. A latch-based memory, comprising:
    a plurality of master/slave latch-based columns, each column including a master latch configured to drive a master-latched data signal to a plurality of slave latches, the plurality of slave latches in each column arranged corresponding to a plurality of rows, the slave latches for each row being configured to be clocked by a corresponding row write clock;
    means for gating the row write clocks responsive to a write operation for an active one of the rows such that the row write clocks for a remaining inactive portion of the rows are gated by being held in a first clock state and such that the row write clock for the active row is not gated; and
    means for resetting the slave latches by holding each row write clock in a second clock state responsive to an assertion of a reset signal.

13. The latch-based memory of claim 12, wherein the slave latches in each column are configured to latch the master-latched data signal from the corresponding master latch responsive to their corresponding row write clocks being in the second clock state.

14. The latch-based memory of claim 13, wherein each master latch is configured to receive the reset signal and to reset its master-latched data signal accordingly responsive to an assertion of the reset signal.

15. The latch-based memory of claim 14, wherein each master latch is configured to latch the master-latched data signal responsive to a receipt of a master write clock in the first clock state.

16. The latch-based memory of claim 15, further comprising means for gating the master write clock.

17. A method, comprising:
    in a memory including a plurality of slave latches arranged into a plurality of rows and columns, each row receiving its own row write clock, selecting a row to be active for a write operation, a remainder of the rows being inactive;

writing to the active row by passing a write clock as the row write clock to the slave latches in the active row while gating the write clock from the slave latches in the inactive rows, wherein gating the write clock comprises holding the row write clocks for the inactive rows in a first clock state; and resetting the slave latches responsive to the assertion of a reset signal by holding the row write clocks in a second clock state.

18. The method of claim 17, wherein resetting the slave latches is responsive to an assertion of a reset signal.

19. The method of claim 17, wherein resetting the slave latches further comprises resetting a plurality of master latches, wherein each master latch drives a master-latched data signal to a corresponding column of the slave latches.

20. The method of claim 17, further comprising detecting a fault for a given row write clock by receiving the given row write clock in a flip-flop contained within a partial scan chain; and shifting a content of the flip-flop through the partial scan chain.

* * * * *